(12) United States Patent
Yang et al.

(10) Patent No.: US 9,935,228 B2
(45) Date of Patent: Apr. 3, 2018

(54) SOLAR CELL AND METHOD FOR MANUFACTURING THE SAME

(71) Applicant: LG ELECTRONICS INC., Seoul (KR)

(72) Inventors: Youngsung Yang, Seoul (KR); Junghoon Choi, Seoul (KR); Chungyi Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/830,480

(22) Filed: Aug. 19, 2015

(65) Prior Publication Data

US 2016/0056322 A1 Feb. 25, 2016

(30) Foreign Application Priority Data

Aug. 20, 2014 (KR) ........................ 10-2014-0108303

(51) Int. Cl.
*H01L 31/068* (2012.01)
*H01L 31/0224* (2006.01)
(Continued)

(52) U.S. Cl.
CPC .... *H01L 31/068* (2013.01); *H01L 31/022425* (2013.01); *H01L 31/022441* (2013.01);
(Continued)

(58) Field of Classification Search
CPC .................................................. H01L 31/068
See application file for complete search history.

(56) References Cited

U.S. PATENT DOCUMENTS

| 7,468,485 B1 | 12/2008 | Swanson |
| 2007/0256728 A1 | 11/2007 | Cousins |

(Continued)

FOREIGN PATENT DOCUMENTS

| GB | 2491209 A | 11/2012 | |
| GB | 2503515 A * | 1/2014 | ..... H01L 31/022441 |

(Continued)

OTHER PUBLICATIONS

L.A. Nesbit, "Annealing characteristics of Si-rich SiO2 films", Applied Physics, Letter 46 (1), pp. 38-40.*

(Continued)

*Primary Examiner* — Devina Pillay
*Assistant Examiner* — Daniel P Malley, Jr.
(74) *Attorney, Agent, or Firm* — Birch, Stewart, Kolasch & Birch, LLP

(57) ABSTRACT

A solar cell is discussed, and the solar cell includes: a semiconductor substrate; a tunneling layer on a surface of the semiconductor substrate; a buffer layer on the tunneling layer, wherein the buffer layer is a separate layer from the tunneling layer and includes an intrinsic buffer portion, and wherein at least one of a material, a composition and a crystalline structure of the buffer layer is different from those of the tunneling layer; a conductive type region on the tunneling layer, and including a first conductive type region having a first conductive type and a second conductive type region having a second conductive type; and an electrode connected to the conductive type region. The buffer layer is positioned adjacent to the tunneling layer and is apart from the electrode.

16 Claims, 6 Drawing Sheets

(51) Int. Cl.
  *H01L 31/0352*  (2006.01)
  *H01L 31/0745*  (2012.01)
  *H01L 31/065*   (2012.01)
  *H01L 31/18*    (2006.01)
  *H01L 31/0747*  (2012.01)

(52) U.S. Cl.
  CPC .............. *H01L 31/03529* (2013.01); *H01L 31/035209* (2013.01); *H01L 31/035272* (2013.01); *H01L 31/065* (2013.01); *H01L 31/0745* (2013.01); *H01L 31/0747* (2013.01); *H01L 31/18* (2013.01); *Y02E 10/50* (2013.01)

(56) References Cited

U.S. PATENT DOCUMENTS

| | | | | |
|---|---|---|---|---|
| 2009/0233426 | A1* | 9/2009 | Poplavskyy | H01L 21/02381 438/502 |
| 2011/0306164 | A1 | 12/2011 | Kim et al. | |
| 2013/0233378 | A1* | 9/2013 | Moslehi | H01L 31/035281 136/256 |
| 2014/0061531 | A1* | 3/2014 | Faur | H01L 31/068 252/79.3 |
| 2014/0096819 | A1* | 4/2014 | Kirkengen | H01L 31/022441 136/255 |
| 2016/0020342 | A1* | 1/2016 | Heng | H01L 31/022441 136/256 |

FOREIGN PATENT DOCUMENTS

| | | |
|---|---|---|
| KR | 10-2009-0009224 A | 1/2009 |
| KR | 10-2011-0135609 A | 12/2011 |
| KR | 10-2013-0068962 A | 6/2013 |

OTHER PUBLICATIONS

City University of Hong Kong, "Chapter 8: Diffusion", 2002, http://personal.cityu.edu.hk/~appkchu/AP4120/8.PDF, All Pages.*

* cited by examiner

SOLAR CELL AND METHOD FOR MANUFACTURING THE SAME

CROSS-REFERENCE TO RELATED APPLICATION

This application claims the priority benefit of Korean Patent Application No. 10-2014-0108303, filed on Aug. 20, 2014 in the Korean Intellectual Property Office, the disclosure of which is incorporated herein by reference.

BACKGROUND OF THE INVENTION

1. Field of the Invention

The present invention relates to a solar cell and a method for manufacturing the same and, more particularly, to a solar cell having a tunneling structure and a method for manufacturing the same.

2. Description of the Related Art

In recent years, as conventional energy resources such as petroleum and coal are running out, interest in alternative energy resources to replace these energy resources is on the rise. Of these, solar cells which convert solar energy into electrical energy are attracting considerable attention as next generation cells.

Such a solar cell is manufactured by forming various layers and electrodes according to a design. Efficiency of solar cells may be determined according to the design of various layers and electrodes. Low efficiency should be overcome so that solar cells can be put to practical use. Accordingly, various layers and electrodes should be designed such that solar cell efficiency is maximized.

SUMMARY OF THE INVENTION

Embodiments of the invention provide a solar cell having enhanced efficiency and a method for manufacturing the same.

A solar cell according to an embodiment of the invention includes: a semiconductor substrate; a tunneling layer on a surface of the semiconductor substrate; a buffer layer on the tunneling layer, wherein the buffer layer is a separate layer from the tunneling layer and including an intrinsic buffer portion, and wherein at least one of a material, a composition and a crystalline structure of the buffer layer is different from those of the tunneling layer; a conductive type region on the tunneling layer, and including a first conductive type region having a first conductive type and a second conductive type region having a second conductive type; and an electrode connected to the conductive type region. The buffer layer is positioned adjacent to the tunneling layer and is apart from the electrode.

A method for manufacturing a solar cell according to an embodiment of the invention includes: forming a tunneling layer on a surface of a semiconductor substrate; forming a buffer layer on the tunneling layer, wherein the buffer layer is a separate layer from the tunneling layer and including an intrinsic buffer portion, and wherein at least one of a material, a composition and a crystalline structure of the buffer layer is different from those of the tunneling layer; forming a conductive type region by doping dopants on the tunneling layer, wherein the conductive type region includes a first conductive type region having a first conductive type and a second conductive type region having a second conductive type on the tunneling layer; and forming an electrode connected to the conductive type region.

DETAILED DESCRIPTION OF THE EMBODIMENTS

Figure 1:
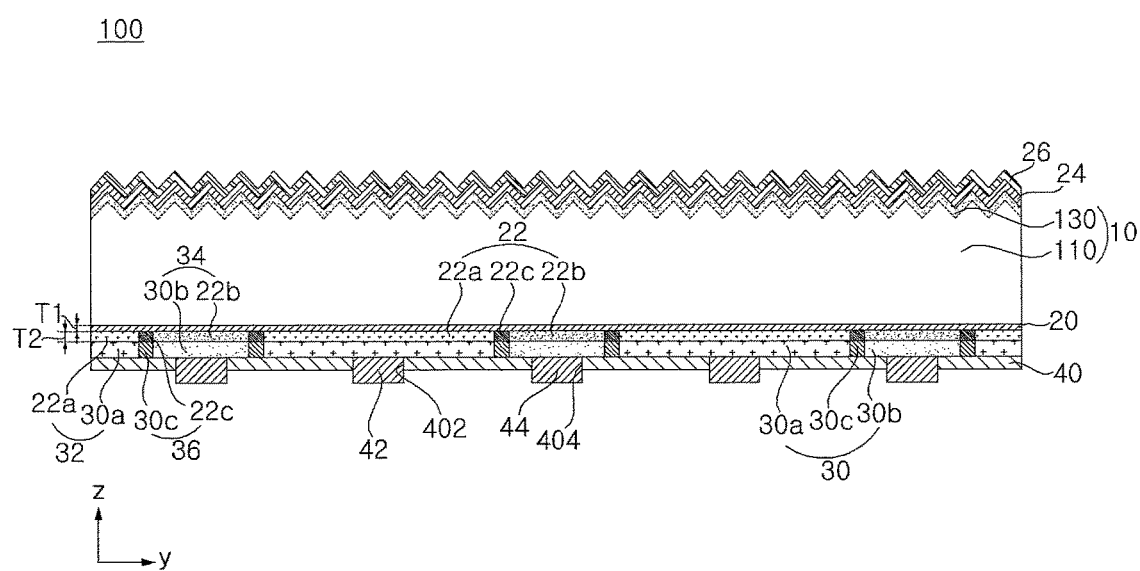
FIG. 1 is a sectional view of a solar cell according to an embodiment of the invention.

Reference will now be made in detail to embodiments of the invention, examples of which are illustrated in the accompanying drawings. However, the embodiments of the invention may be embodied in many different forms and should not be construed as limited to the embodiments set forth herein.

Only elements constituting features of the embodiments of the invention are illustrated in the accompanying drawings and other elements not constituting features of the embodiments of the invention will not be described herein and omitted from the drawings, for clarity of description. Like reference numerals refer to like elements throughout. In the drawings, the thicknesses, areas, etc., of constituent elements may be exaggerated or reduced for clarity and convenience of illustration. The invention is not limited to the illustrated thicknesses, areas, etc.

It will be further understood that, throughout this specification, when one element is referred to as "comprising" or "including" another element, the term "comprising" or "including" specifies the presence of another element but does not preclude the presence of other additional elements, unless context clearly indicates otherwise. In addition, it will be understood that when one element such as a layer, a region or a plate is referred to as being "on" another element, the one element may be directly on the another element, and one or more intervening elements may also be present. In contrast, when one element such as a layer, a region or a plate is referred to as being "directly on" another element, one or more intervening elements are not present.

Hereinafter, a solar cell according to an embodiment of the invention will be described in detail with reference to the accompanying drawings.

Figure 2:
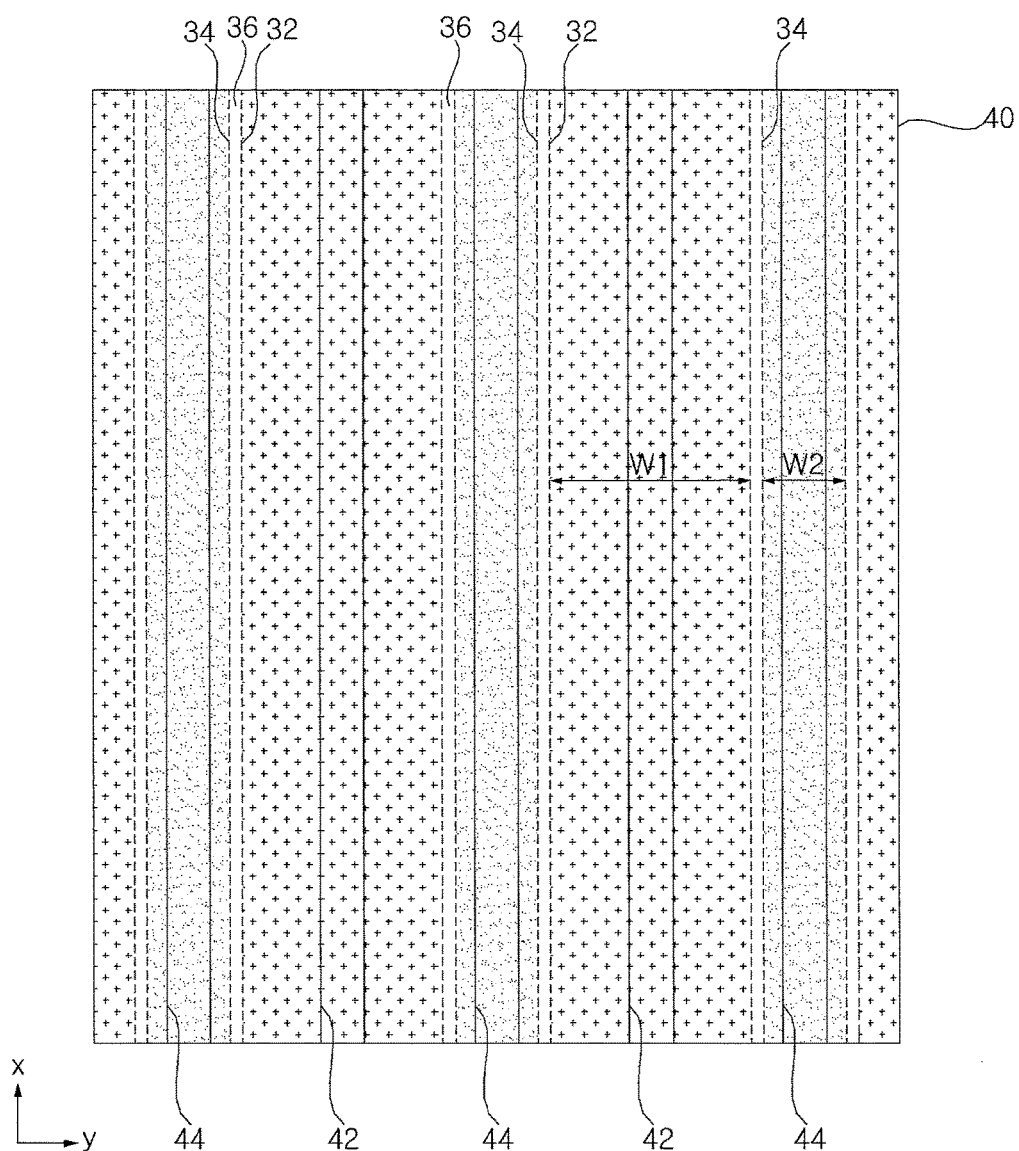
FIG. 2 is a partial rear plan view of the solar cell illustrated in FIG. 1.

FIG. 1 is a sectional view of a solar cell according to an embodiment of the invention, and FIG. 2 is a partial rear plan view of the solar cell illustrated in FIG. 1.

Referring to FIGS. 1 and 2, a solar cell 100 according to an embodiment includes a semiconductor substrate 10 including a base region 110, a tunneling layer 20 on a surface of the semiconductor substrate 10, a buffer layer 22 on the tunneling layer 20, a conductive type region (or conductive type regions) 32 and 34 formed at the buffer layer 22 and/or on the buffer layer 22, and an electrode (or electrodes) 42 and 44 connected to the conductive type regions 32 and 34. The buffer layer 22 is a separate layer or a different layer from the tunneling layer 20 and includes a buffer portion 22c. The buffer layer 22 is positioned adjacent to the tunneling layer 20 and is apart from the electrode 42 and 44. In the embodiment of the invention, the buffer layer 22 may include a semi-insulating material (or the buffer layer 22 may be formed of a layer including or consisting of a semi-insulating material) having a material, a composition, and/or a crystalline structure different from those of the tunneling layer 20. The conductive type region may include a first conductive type region 32 having a first conductive type and a second conductive type region 34 having a second conductive type. The first and second conductive type portions 32 and 34 are positioned on the same plane. A barrier region 36 may be positioned between the first conductive type region 32 and the second conducive type region 34. The buffer portion 22c may constitute a part of the barrier region 36. Also, the solar cell 100 may further include a passivation layer 24, an anti-reflective layer 26, an insulating layer 40, and the like. This will be described in more detail.

The semiconductor substrate 10 may include the base region 110 including the second conductive type dopant (of dopants) with a relatively low doping concentration to have the second conductive type. The base region 110 may include crystalline semiconductor including the second conductive type dopant. For example, the base region 110 may include a single-crystalline or polycrystalline semiconductor (for example, single-crystalline or polycrystalline silicon) including the second conductive type dopant. Particularly, the base region 110 may be a single-crystalline semiconductor (e.g., a single-crystalline wafer, more particularly, a single-crystalline silicon wafer) including the second conductive type dopant. When the base region 110 includes the single-crystalline silicon, the solar cell 100 is a single-crystalline silicon solar cell. The solar cell 100 is based on the base region 110 or the semiconductor substrate 10 including the single-crystalline silicon with a high degree of crystallinity and a low degree of defects, and thus, the solar cell 100 has an enhanced electrical property.

The second conductive type may be an n-type or a p-type. For example, when the base region 110 is an n-type, the first conductive type region 32 of a p-type to form a junction (e.g., a pn junction with the tunneling layer 20 disposed therebetween) that forms carriers by a photoelectric conversion with the base region 110 has a wide area and thus a photoelectric conversion area may be increased. In addition, in this instance, the first conductive type region 32 having a wide area effectively collects holes having a relatively slow movement rate and thus may further contribute to improvement in photoelectric conversion efficiency. However, the embodiment of the invention is not limited to the above examples.

In addition, the semiconductor substrate 10 may include a front surface field region 130 at a front surface thereof. The front surface field region 130 may have the same conductive type as that of the base region 110 and a higher doping concentration than the base region 110.

In the embodiment of the invention, the front surface field region 130 is a doping region formed by doping the semiconductor substrate 10 with a second conductive type dopant at a relatively high doping concentration. Accordingly, the front surface field region 130 constitutes the semiconductor substrate 10, including a crystalline (single-crystalline or polycrystalline) semiconductor of the second conductive type. For example, the front surface field region 130 may be formed as a portion of a single-crystalline semiconductor substrate (e.g., a single-crystalline silicon wafer substrate) of a second conductive type. However, the embodiment of the invention is not limited to the above examples. Thus, the front surface field region 130 may be formed by doping a semiconductor layer separated from the semiconductor substrate 10 (e.g., an amorphous semiconductor layer, a microcrystalline semiconductor layer, or a polycrystalline semiconductor layer) with a second conductive type dopant. In another embodiment of the invention, the front surface field region 130 may be a field region that acts similarly to a region formed through doping by fixed charges of a layer (e.g., the passivation layer 24 and/or the anti-reflective layer 26) formed adjacent to the semiconductor substrate 10. For example, when the base region 110 is the n-type, the passivation layer 24 may include an oxide having fixed negative charge (for example, an aluminum oxide) to form an inversion layer at the surface of the base region 110. The inversion layer may be used as the field region. In this instance, the semiconductor substrate 10 does not include an additional doping region other than the base region 110, and thus, the defect of the semiconductor substrate 10 can be minimized. The front surface field region 130 having various structures may be formed using various other methods.

In the embodiment of the invention, the front surface of the semiconductor substrate 10 may be textured to have an uneven surface (or protruded portions and/or depressed portions) in the form of a pyramid, or the like. Through the texturing process, the uneven portion is formed at the front surface of the semiconductor substrate 10 and thus surface roughness thereof increases, whereby reflectance of light incident upon the front surface of the semiconductor substrate 10 may be reduced. Accordingly, the amount of light reaching a pn junction formed by the base region 110 and the first conductive type region 32 may be increased and, consequently, light loss may be minimized.

Meanwhile, the back surface of the semiconductor substrate 10 may be a relatively smooth and even surface formed by mirror polishing or the like and having a lower surface roughness than the front surface of the semiconductor substrate 10. As in the embodiment of the invention, when the first and second conductive type regions 32 and 34 are formed together on the back surface of the semiconductor substrate 10, characteristics of the solar cell 100 may largely vary according to characteristics of the back surface of the semiconductor substrate 10. Since an uneven portion by texturing is not formed at the back surface of the semiconductor substrate 10, passivation characteristics may be enhanced and, accordingly, the characteristics of the solar cell 100 may be enhanced. However, the embodiment of the invention is not limited to the above example. In some instances, an uneven portion may be formed at the back surface of the semiconductor substrate 10 by texturing. In addition, various modifications are possible.

The tunneling layer 20 may be formed on the back surface of the semiconductor substrate 10. The tunneling layer 20 acts as a kind of a barrier to electron and hole. Thus, minority carrier cannot pass through the tunneling layer 20. Meanwhile, majority carrier is accumulated at a portion adjacent to the tunneling layer 20, and then, the majority carrier having the predetermined energy passes through the tunneling layer 20. In this instance, the majority carrier having the predetermined energy can easily and smoothly pass through the tunneling layer 20 by a tunneling effect. Also, the tunneling layer 20 also acts as a diffusion barrier for preventing the dopant of the conductive type regions 32 and 34 from diffusing into the semiconductor substrate 10. The tunneling layer 20 may include various materials enabling majority carriers to tunnel therethrough, e.g., an oxide, a nitride, a semiconductor, a conductive polymer, or the like. For example, the tunneling layer 20 may include a silicon oxide, a silicon nitride, a silicon oxynitride, an intrinsic amorphous silicon, an intrinsic poly-crystalline silicon, or the like. Particularly, the tunneling layer 20 may be formed of a silicon oxide layer including a silicon oxide.

The silicon oxide layer has an enhanced passivation property and the carrier can easily pass through the silicon oxide layer by the tunneling effect.

The tunneling layer 20 may be formed over the entire back surface of the semiconductor substrate 10. Accordingly, the tunneling layer 20 can be easily formed without a separate patterning.

To have sufficient tunneling effects, the tunneling layer 20 may have a thickness T1 that is smaller than that of the insulating layer 40. For example, the thickness T1 of the tunneling layer 20 may be about 1.8 nm or less, for example, about 0.1 nm to about 1.5 nm (more particularly, about 0.5 nm to about 1.2 nm). When the thickness T1 of the tunneling layer 20 exceeds about 1.8 nm, tunneling does not smoothly occur and thus the efficiency of the solar cell 100 may decrease. On the other hand, when the thickness T1 of the tunneling layer 20 is less than about 0.1 nm, it may be difficult to form the tunneling layer 20 with desired quality. To further improve the tunneling effects, the thickness T1 of the tunneling layer 20 may be about 0.1 nm to about 1.5 nm (more particularly, about 0.5 nm to about 1.2 nm). In the embodiment of the invention, the buffer layer 22 having the buffer portion 22c acting as the barrier is disposed on the tunneling layer 20. Thus, although the thickness T1 of the tunneling layer 20 is relatively small compared with the conventional tunneling layer, the tunneling at undesirable positions can be effectively prevented by the buffer layer 22 or the buffer portion 22c. However, the embodiment of the invention is not limited to the above examples and the thickness T1 of the tunneling layer 20 may have various values.

In the embodiment of the invention, the buffer layer 22 including the buffer portion 22c is disposed on the tunneling layer 20, the conductive type regions 32 and 34 are formed at and/or formed on the buffer layer 22, which is disposed on the tunneling layer 20. Hereinafter, the conductive type regions 32 and 34 will be described, and then, the buffer layer 22 will be described in detail.

The conductive type regions 32 and 34 may include the first conductive type region 32 including the first conductive type dopant thus having the first conductive type and the second conductive type region 34 including the second conductive type dopant thus having the second conductive type. The first conductive type region 32 and the second conductive type region 34 are positioned on the same plane on the tunneling layer 20. In addition, the barrier region 36 may be disposed between the first and second conductive type regions 32 and 34 so that the barrier region 36, and the first and second conductive type regions 32 and 34 are positioned on the same plane. That is, at least a part of side surfaces of the first conductive type region 32, the barrier region 36, and the second conductive type region 34 may be adjacent to (or in a contact with) each other.

The first conductive type region 32 forms a pn junction (or pn tunnel junction) with the base region 110 while disposing the tunneling layer 20 therebetween. Thus, the first conductive type region 32 constitutes an emitter region that generates carriers by a photoelectric conversion. Also, the second conductive type region 34 forms a back surface field region that forms a back surface field and thus prevents or reduces loss of carriers by recombination at a surface (more particularly, the back surface) of the semiconductor substrate 10. Also, the barrier region 36 separates the first conductive type region 32 from the second conductive type region 34. When the first and second conductive type regions 32 and 34 contact each other, shunting may occur and, accordingly, performance of the solar cell 100 may be deteriorated. Thus, in the embodiment of the invention, the barrier region 36 may be disposed between the first and second conductive type regions 32 and 34 to prevent unnecessary occurrence of shunting.

In the embodiment of the invention, the first conductive type region 32 may include a first portion 22a having the first conductive type and formed at the buffer layer 22, and a first doping portion 30a having the first conductive type and disposed on the first portion 22a of the buffer layer 22. The first portion 22a may be a portion formed by a diffusion of the dopant in the first doping portion 30a during a heat-treating of the forming process of the first doping portion 30a or during a heat-treating after the forming process of the first doping portion 30a. Accordingly, the first portion 22a and the first doping portion 30a have corresponding or the same shapes at the same positions to be entirely overlapped with each other in a plan view. When the first doping portion 30a is formed by the doping as in the above and the first portion 22a is formed by the diffusion during the doping or after the doping, the first conductive type dopant of the first portion 22a and the first conductive type dopant of the first doping portion 30a are the same material, and a doping concentration of the first portion 22a may be the same as or smaller than a doping concentration of the first doping portion 30a. Particularly, the doping concentration of the first portion 22a may be smaller than the doping concentration of the first doping portion 30a.

The first conductive type dopant of the first conductive type region 32 may be any dopant having a conductive type opposite the base region 110. That is, when the first conductive type is a p-type, the first conductive type dopant may be a Group III element such as B, Al, Ga, In, or the like. When the first conductive type is an n-type, the first conductive type dopant may be a Group V element such as P, As, Bi, Sb, or the like.

In the embodiment of the invention, the second conductive type region 32 may include a second portion 22b having the second conductive type and formed at the buffer layer 22, and a second doping portion 30b having the second conductive type and disposed on the second portion 22b of the buffer layer 22. The second portion 22b may be a portion formed by a diffusion of the dopant in the second doping portion 30b during a heat-treating of the forming process of the second doping portion 30b or during a heat-treating after the forming process of the second doping portion 30b. Accordingly, the second portion 22b and the second doping portion 30b have corresponding or the same shapes at the same positions to be entirely overlapped with each other in a plan view. When the second doping portion 30b is formed by the doping as in the above and the second portion 22b is formed by the diffusion during the doping or after the doping, the second conductive type dopant of the second portion 22b and the second conductive type dopant of the second doping portion 30b are the same material, and a doping concentration of the second portion 22b may be the same as or smaller than a doping concentration of the second doping portion 30b. Particularly, the doping concentration of the second portion 22b may be smaller than the doping concentration of the second doping portion 30b.

The second conductive type dopant of the second conductive type region 34 may be any dopant having the same conductive type as that of the base region 110. That is, when the second conductive type is of an n-type, the second conductive type dopant may be a Group V element such as P, As, Sb, or the like. When the second conductive type is of a p-type, the second conductive type dopant may be a Group III element such as B, Al, Ga, In, or the like.

In the embodiment of the invention, the barrier region 36 may include the buffer portion 22c formed at the buffer layer 22 between the first portion 22a and the second portion 22b and the barrier portion 30c between the first doping portion 30a and the second doping portion 30b at the semiconductor layer 30. The buffer portion 22c or the barrier portion 30c may include an intrinsic material or an undoped material that does not substantially include the first and second conductive type dopants. However, the embodiments of the invention are not limited thereto. One or more of various materials are used for the barrier portion 30c. This will be described in more detail later.

Hereinafter, the buffer portion 22c, and the first and second portions 22a and 22b of the buffer layer 22 will be described in detail, and then, the barrier portion 30c, and the first and second doping portions 30a and 30b of the semiconductor layer 30 will be described in detail.

The buffer layer 22 (more particularly, the buffer portion 22c) is positioned between the first conductive type region 32 and the second conductive type region 34 on the tunneling layer 20. The buffer layer 22 prevents the recombination of the electron and the hole between the first conductive type region 32 and the second conductive type region 34. This will be described in more detail.

The tunneling probability is deeply related to the thickness of the tunneling layer 20. Thus, when the thickness of the tunneling layer 20 is larger than the predetermined value (for example, larger than 2 nm), the tunneling probability may be converged to nearly zero (0). Therefore, in order to secure high tunneling probability, the tunneling layer 20 should be thin. However, when the tunneling layer 20 is thin, the carrier can be transferred to the barrier region 36 by the tunneling. Although the mobility of the carrier is small because the barrier region 36 is intrinsic, the carrier at the barrier region 36 with a small amount may flow because the barrier region 36 includes the semiconductor material. Particularly, since the electron has large mobility, the electron reaching the barrier region 36 may be transferred to one of the conductive type regions 32 and 34 where the hole is the majority carrier (that is, one of the conductive type regions 32 and 34 having the p-type). Then, the recombination may be generated at the boundary or interface between the barrier region 36 and one of the conductive type regions 32 and 34 having the p-type.

Considering the above, in the embodiment of the invention, the buffer portion 22c formed of a semi-insulating material is additionally disposed on the tunneling layer 20 at a portion corresponding to the barrier region 36 or the barrier portion 30c. Thus, the tunneling to the barrier region 36 can be prevented. In order to effectively prevent the tunneling to the barrier region 36 (particularly, the barrier portion 30c), the buffer layer 22 including the buffer portion 22c may have a crystalline structure, a material, and/or a composition different from a crystalline structure, a material, and/or a composition of the tunneling layer 20. Also, the buffer layer 22 has an insulating property lower than that of the tunneling layer 20. As described in the above, the part of the buffer layer 22 acts as a part of the conductive type regions 32 and 34 by the dopant. Thus, if the buffer layer 22 has an insulating property only, the tunneling to the first and second conductive type regions 32 and 34 or the first and second doping portions 30a and 30b may be prevented. Therefore, the buffer layer 22 may include the semi-insulating material so that the buffer portion 22c can prevent the tunneling of the carrier and the first and second portions 22a and 22b can act as the first and second conductive type regions 32 and 34 by the doping.

For reference, the semi-insulating material has sufficient insulating property when the dopant is not doped. When the semi-insulating material is doped, the carrier tunneling or the carrier transferring is generated and the portion of the semi-insulating material may act as the first and second conductive type regions 32 and 34.

For example, the buffer layer 22 may include or consist of a silicon oxide layer having a poly-crystalline structure. When the buffer layer 22 includes or consists of the silicon oxide layer having the poly-crystalline structure, the dopant can be easily doped to the buffer layer 22, the thermal stability is high, and the buffer layer 22 can have energy band gap for easily inducing the tunneling.

When the tunneling layer 20 includes or consists of a silicon oxide layer, the crystalline structure and the composition of the buffer layer 22 are different from the crystalline structure and the composition of the tunneling layer 20, respectively. That is, the tunneling layer 20 may include an amorphous structure, while the buffer layer 22 may include a poly-crystalline structure, which is one of crystalline structures. Also, the oxygen amount and the silicon amount of the buffer layer 22 may be different from the oxygen amount and the silicon amount of the tunneling layer 20. More particularly, the oxygen amount of the buffer layer 22 may be smaller than the oxygen amount of the tunneling layer 20, and the silicon amount of the buffer layer 22 may be larger than the silicon amount of the tunneling layer 20. The dopant may be easily coupled to the silicon than the oxygen. Thus, when the silicon amount is high and the oxygen amount is low, the amount of the dopant coupled to the silicon increases, and thus, the amount of silicon-dopant bond (for example, B—Si bond or P—Si bond) increases. Thus, the portion of the buffer layer 22 where the silicon amount is high and the oxygen amount is low by the tunneling and the dopant is doped is conductive, and thus, the carrier can pass through the portion of the buffer layer 22 by the tunneling.

For example, the tunneling layer 20 may have chemical formula the same as or similar to $SiO_2$ (for example, $SiO_y$, wherein y is in a range of about 1.9 to about 2.1), while the buffer layer 22 may have chemical formula of $SiO_x$ (wherein, x is in a range of about 0.2 to about 1.5). Or, the tunneling layer 20 has the oxygen amount of about 60 at % to about 70 at %, while the buffer layer 22 includes a portion having the oxygen amount of about 10 at % to about 45 at %. Particularly, a portion of the buffer layer 22 adjacent to the tunneling layer 20 may have the oxygen amount of about 10 at % to about 45 at %. That is, the tunneling layer 20 has the relatively high oxygen amount to sufficiently perform the tunneling barrier and to be chemically stable. Meanwhile, the buffer layer 22 has the relatively low oxygen amount to easily form the silicon-dopant bond. More particularly, x of the chemical formula of the buffer layer 22 is smaller than about 0.2 or the oxygen amount of the buffer layer 22 is smaller than 10 at %, the buffer portion 22c may not act as the tunneling barrier. Also, x of the chemical formula of the buffer layer 22 is larger than about 1.5 or the oxygen amount of the buffer layer 22 is larger than 45 at %, the doping to the buffer layer 22 may be not sufficient and the carrier flow to the first and second portions 22a and 22b may be not smooth. However, the embodiments of the invention are not limited thereto. The chemical formulas, the oxygen amounts, and so on of the tunneling layer 20 and the buffer layer 22 may be varied.

In the above embodiment of the invention, each of the buffer layer 22 and the tunneling layer 20 includes the silicon oxide layer, and the compositions, the crystalline structures, and the properties of the silicon layers of the buffer layer 22 and the tunneling layer 20 are different from each other. However, the embodiments of the invention are not limited thereto. The buffer layer 22 may include a material different from a material of the tunneling layer 20. Also, various modifications are possible.

In the embodiment of the invention, a thickness T2 of the buffer layer 22 is larger than a thickness T1 of the tunneling layer 20. Since the thickness T1 of the tunneling layer 20 is deeply related to the tunneling probability as stated in the above, it is preferable but not required that the tunneling layer 20 is thin. Also, the buffer layer 22 has a relatively large thickness in order to prevent the undesirable tunneling.

For example, a ratio of the thickness T1 of the tunneling layer 20: the thickness T2 of the buffer layer 22 is in a range of about 1:1.5 to about 1:10. When the ratio is smaller than 1:1.5, the effect of the buffer layer 22 for preventing the tunneling to the barrier region 36 may be not sufficient. When the ratio is larger than 1:10, the thickness of the solar cell 100 may be increased and the process time may be increased by the buffer layer 22, and the properties of the conductive type regions 32 and 34 may be deteriorated. That is, as described in the above, the first and second portions 22a and 22b act as parts of the first and second conductive type regions 32 and 34 by the dopants, respectively. If the first and second portions 22a and 22b having a relatively low doping concentration are thick, the properties of the conductive type regions 32 and 34 may be deteriorated.

Selectively, the thickness T2 of the buffer layer 22 may be about 10 nm or less. When the thickness T2 of the buffer layer 22 exceeds 10 nm, the thickness of the solar cell 100 may be increased and the process time may be increased by the buffer layer 22, and the properties of the conductive type regions 32 and 34 may be deteriorated. For example, the thickness T2 of the buffer layer 22 may be in a range of about 2 nm to about 10 nm. When the thickness T2 of the buffer layer 22 is smaller than about 2 nm, the effect of the buffer layer 22 for preventing the tunneling to the barrier region 36 may be not sufficient. Considering further the thickness of the solar cell 100, the process time, and the properties of the conductive type regions 32 and 34, the thickness T2 of the buffer layer 22 may be in a range of about 2 nm to about 5 nm. However, the embodiments of the invention are not limited thereto. The thickness of the buffer layer 22 may be varied.

The above thickness T2 of the buffer layer 22 is based on the instance that the buffer layer 22 is not doped by a separate doping, and the dopant in the semiconductor layer 30 is diffused into the buffer layer 22 by the diffusion. Therefore, when the buffer layer 22 is doped by a separate doping different from the semiconductor layer 30, there is no restriction to the thickness T2 of the buffer layer 22. Thus, in this instance, the thickness T2 of the buffer layer 22 may have a thickness larger than the above range, for example, the thickness of the buffer layer 22 may be about 300 nm or less. Various modifications are possible.

The buffer portion 22c of the buffer layer 22 has the material, the crystalline structure, the thickness, and the property of the buffer layer 22 described in the above, and does not include the first and second conductive type dopants. The first portion 22a of the buffer layer 22 has the material, the crystalline structure, the thickness, and the property of the buffer layer 22 described in the above, and includes the first conductive type dopant. The second portion 22b of the buffer layer 22 has the material, the crystalline structure, the thickness, and the property of the buffer layer 22 described in the above, and includes the second conductive type dopant. That is, the first portion 22a of the buffer layer 22 is the silicon oxide layer having the oxygen amount of about 10 at % to about 45 at %, having chemical formula of SiOx (wherein, x is in a range of about 0.2 to about 1.5), and being doped with the first conductive type dopant. The second portion 22b of the buffer layer 22 is the silicon oxide layer having the oxygen amount of about 10 at % to about 45 at %, having chemical formula of SiOx (wherein, x is in a range of about 0.2 to about 1.5), and being doped with the second conductive type dopant. Also, the buffer portion 22c is positioned between the first portion 22a and the second portion 22b to correspond to the barrier region 36 or the barrier portion 30c. The buffer portion 22c is the silicon oxide layer having the oxygen amount of about 10 at % to about 45 at %, having chemical formula of SiOx (wherein, x is in a range of about 0.2 to about 1.5), and being an undoped or intrinsic region.

Particularly, as stated in the above, the dopant exists in a state that the dopant is bonded to (or have a bond with) the semiconductor material (that is, silicon) of the semi-insulating material constituting the buffer layer 22 at the first and second portions 22a and 22b. That is, the silicon-dopant bond exists in the first and second portions 22a and 22b of the buffer layer 22. For example, when boron (B) is used for the p-type dopant at the first portion 22a, the silicon-boron bond (Si—B bond) exists in the first portion 22a. For example, when phosphorus (P) is used for the n-type dopant at the second portion 22b, the silicon-phosphorus bond (Si—P bond) exists in the second portion 22b. That is, the first and second conductive type dopants exist in the activated state (that is, the first and second conductive type dopants bonded or coupled to the semiconductor material (that is, silicon) of the buffer layer 22). Thus, the first and second portions 22a and 22b can act as parts of the conductive type regions 32 and 34, respectively. The silicon-dopant bond may be detected by various methods, such as a secondary ion mass spectrometry (SIMS).

The semiconductor layer 30 is disposed on the buffer layer 22. The semiconductor layer 30 may include a first doping portion 30a constituting a part of the first conductive type region 32, a second doping portion 30b constituting a part of the second conductive type region 34, and the barrier portion 30c being intrinsic and positioned between the first doping portion 30a and the second doping portion 30b.

The first doping portion 30a on the first portion 22a may include a semiconductor (e.g., silicon) including the first conductive type dopant opposite the base region 110. In the embodiment of the invention, the first doping portion 30a is formed separately from the semiconductor substrate 10, on the semiconductor substrate 10 (more particularly, on the first portion 22a disposed on the tunneling layer 20). The first doping portion 30a may be formed of a semiconductor layer doped with the first conductive type dopant. Thus, the first doping portion 30a may be formed of a semiconductor layer having a different crystal structure from the semiconductor substrate 10 so as to be easily formed on the semiconductor substrate 10. For example, the first doping portion 30a may be formed by doping an amorphous semiconductor, a micro-crystalline semiconductor or a polycrystalline semiconductor (e.g., amorphous silicon, micro-crystalline silicon, or polycrystalline silicon) that may be easily manufactured by various methods such as deposition and the like, with the first conductive type dopant. The first conductive type dopant may be included in the semiconductor layer when forming the semiconductor layer 30 or may be included in the semiconductor layer 30 by various doping methods such as thermal diffusion, ion implantation, and the like after forming the semiconductor layer 30.

The second doping portion 30b on the second portion 22b may include a semiconductor (e.g., silicon) including the first conductive type dopant the same as the base region 110. In the embodiment of the invention, the second doping portion 30b is formed separately from the semiconductor substrate 10, on the semiconductor substrate 10 (more particularly, on the second portion 22b disposed on the tunneling layer 20). The second doping portion 30b may be formed of a semiconductor layer doped with the second conductive type dopant. Thus, the second doping portion 30b may be formed of a semiconductor layer having a different crystal structure from the semiconductor substrate 10 so as to be easily formed on the semiconductor substrate 10. For example, the second doping portion 30b may be formed by doping an amorphous semiconductor, a microcrystalline semiconductor or a polycrystalline semiconductor (e.g., amorphous silicon, micro-crystalline silicon, or polycrystalline silicon) that may be easily manufactured by various methods such as deposition and the like, with the second conductive type dopant. The second conductive type dopant may be included in the semiconductor layer when forming the semiconductor layer 30 or may be included in the semiconductor layer 30 by various doping methods such as thermal diffusion, ion implantation, and the like after forming the semiconductor layer 30.

The barrier portion 30c may include one or more of various materials enabling the first and second doping portions 30a and 30b to be substantially insulated from each other. That is, the barrier portion 30c may be formed of an undoped insulating material (e.g., an oxide or a nitride). In another embodiment of the invention, the barrier portion 30c may include an intrinsic semiconductor. In this regard, the first and second doping portions 30a and 30b and the barrier portion 30c are formed on the same plane, have substantially the same thickness, are formed of the same semiconductor (e.g., amorphous silicon, micro-crystalline silicon, or polycrystalline silicon), and the barrier portion 30c may not include a dopant. For example, a semiconductor layer 30 including a semiconductor material may be formed, a region of the semiconductor layer 30 is doped with a first conductive type dopant to form the first conductive type region 32, another region thereof is doped with a second conductive type dopant to form the second conductive type region 34, and the barrier portion 30c may be formed in a region of the semiconductor layer 30 in which the first and second doping portions 30a and 30b are not formed. According to the embodiment of the invention, a manufacturing method of the first and second doping portions 30a and 30b and the barrier portion 30c may be simplified.

However, the embodiment of the invention is not limited to the above examples. That is, when the barrier portion 30c is formed separately from the first and second doping portions 30a and 30b, the barrier portion 30c may have a thickness different from each of thicknesses of the first and second doping portions 30a and 30b. For example, to more effectively prevent short circuit between the first and second doping portions 30a and 30b, the thickness of the barrier portion 30c may be greater than each of thicknesses of the first and second doping portions 30a and 30b. In another embodiment of the invention, to reduce raw material costs for forming the barrier portion 30c, the thickness of the barrier portion 30c may be less than each of thicknesses of the first and second doping portions 30a and 30b. In addition, various modifications are possible. In addition, a base material of the barrier portion 30c may be different from those of the first and second doping portions 30a and 30b. For example, the barrier portion 30c may be formed of an undoped insulating material (for example, an oxide, a nitride, and so on). In another embodiment of the invention, the barrier portion 30c may be formed as an empty space (e.g., a trench) disposed between the first and second doping portions 30a and 30b.

In addition, the barrier portion 30c may be formed so as to partially separate the first and second doping portions 30a and 30b at an interface therebetween from each other. Thus, some portions of the interface between the first and second doping portions 30a and 30b may be separated from each other by the barrier portion 30c, while the other portion of the interface between the first and second doping portions 30a and 30b may contact each other. In this instance, some portions of the interface between the first and second conductive type regions 32 and 34 (or the first and second portions 22a and 22b) may be separated from each other by the barrier region 36 (or the buffer portion 22c), while the other portion of the interface between the first and second conductive regions 32 and 34 (or the first and second portion 22a and 22b) may contact each other. In addition, the barrier portion 30c may not be necessarily formed, and the first and second doping portions 30a and 30b may entirely contact each other. In this instance, the first conductive type region 32 (or the first portion 22a) and the second conductive type region 34 (or the second portion 22b) may entirely contact each other. In addition, various modifications are possible.

In the embodiment of the invention, an instance in which the first and second conductive type regions 32 and 34 are disposed on the back surface of the semiconductor substrate 10 while interposing the tunneling layer 20 between the first and second conductive type regions 32 and 34 and the semiconductor substrate 10 has been described by way of example. However, the embodiment of the invention is not limited to the above example. In another embodiment of the invention, at least one of the first and second conductive type regions 32 and 34 may include a doping region formed by doping the semiconductor substrate 10 with dopants. That is, at least one of the first and second conductive type regions 32 and 34 may include a doping region having a single-crystalline semiconductor structure constituting a part of the semiconductor substrate 10. Also, the conductive type regions 32 and 34 may be formed by the other various methods.

In the embodiment of the invention, the second conductive type region 34 having the same conductive type as that of the base region 110 may have a narrower area than that of the first conductive type region 32 having a different conductive type than that of the base region 110. Thus, a pn junction formed between the base region 110 and the first conductive type region 32 via the tunneling layer 20 may have a wider area. In this regard, when the base region 110 and the second conductive type region 34 are of the n-types and the first conductive type region 32 is of the p-type, the first conductive type region 32 having a wide area may effectively collect holes having a relatively slow movement rate. The planar structure of the first and second conductive type regions 32 and 34 and the barrier region 36 will be described below in further detail with reference to FIG. 2.

An insulating layer 40 may be formed on the first and second conductive type regions 32 and 34 and the barrier region 36. The insulating layer 40 includes a first opening (or first openings) 402 for connecting the first conductive type region 32 and the first electrode 42 and a second opening (or second openings) 404 for connecting the second conductive type region 34 and the second electrode 44. Accordingly, the insulating layer 40 may prevent electrodes to which the first and second conductive type regions 32 and 34 must not be connected (i.e., the second electrode 44 for the first conductive type region 32 and the first electrode 42 for the second conductive type region 34) from being connected to each other. Also, the insulating layer 40 may passivate the first and second conductive type regions 32 and 34 and/or barrier region 36.

The insulating layer 40 may be disposed on (for example, may be in contact with) the semiconductor layer 30 at a portion where the electrodes 42 and 44 are not positioned. The insulating layer 40 may be thicker than the tunneling layer 20. Then, the insulating property and the passivation property of the insulating layer 40 can be enhanced. However, the embodiments of the invention are not limited thereto, and thus, various modifications are possible.

For example, the insulating layer 40 may include various insulating materials (for example, an oxide, a nitride, and so on). For example, the insulating layer 40 may be any one film selected from the group consisting of a silicon nitride film, a hydrogen-containing silicon nitride film, a silicon oxide film, a silicon oxynitride film, an aluminum oxide film, a $MgF_2$ film, a ZnS film, a $TiO_2$ film, and a $CeO_2$ film or have a multilayer structure including two or more of the above-listed films in combination. However, the embodiment of the invention is not limited thereto, and thus, the insulating layer 40 may include one or more of various materials.

The electrodes 42 and 44 disposed on the back surface of the semiconductor substrate 10 include the first electrode 42 electrically and physically connected to the first conductive type region 32 and the second electrode 44 electrically and physically connected to the second conductive type region 34.

In the embodiment of the invention, the first electrode 42 is connected to the first conductive type region 32 through penetrating of the first opening 402 of the insulating layer 40. The second electrode 44 is connected to the second conductive type region 34 through penetrating of the second opening 404 of the insulating layer 40. The first and second electrodes 42 and 44 may include various metal materials. In addition, the first and second electrodes 42 and 44 are not electrically connected to each other but are respectively connected to the first conductive type region 32 and the second conductive type region 34, and may have various planar shapes enabling collection of carriers generated and transfer of the collected carriers to the outside. However, the shapes of the first and second electrodes 42 and 44 are not limited to the above example.

Hereafter, planar shapes of the first and second conductive type regions 32 and 34, the barrier region 36, and the first and second electrodes 42 and 44 will be described in detail with reference to FIG. 2.

Referring to FIG. 2, in the embodiment of the invention, the first and second conductive type regions 32 and 34 are extended so as to have a stripe shape and alternately disposed with respect to each other in a direction crossing a longitudinal direction. The barrier region 36 may be disposed to separate the first conductive type region 32 from the second conductive type region 34. Plural first conductive type regions 32 separated from each other may be connected to each other at an edge of a first side thereof, and plural second conductive type regions 34 separated from each other may be connected to each other at an edge of a second side thereof. However, the embodiment of the invention is not limited to the above examples.

In this regard, the first conductive type region 32 may have a wider area than the second conductive type region 34. For example, the areas of the first and second conductive type regions 32 and 34 may be adjusted by differently adjusting widths thereof. That is, a width W1 of the first conductive type region 32 may be greater than a width W2 of the second conductive type region 34. Thereby, the first conductive type region 32 constituting the emitter region has a wide area, and thus, a photoelectric conversion area may be increased. In this regard, when the first conductive type region 32 is the p-type, the first conductive type region 32 having a wide area may effectively collect holes having a relatively slow movement rate.

In addition, the first electrode 42 may be formed so as to have a stripe shape to correspond to the first conductive type region 32, and the second electrode 44 may be formed so as to have a stripe shape to correspond to the second conductive type region 34. The first and second openings 402 and 404 may be formed to respectively correspond to total lengths (or areas) of the first and second electrodes 42 and 44. Thus, a contact area between the first electrode 42 and the first conductive type region 32 and a contact area between the second electrode 44 and the second conductive type region 34 are maximized and, accordingly, carrier collection efficiency may be enhanced. However, the embodiment of the invention is not limited to the above examples. In addition, the first and second openings 402 and 404 may also be formed so as to respectively connect only portions of the first and second electrodes 42 and 44 to the first and second conductive type regions 32 and 34. For example, the first and second openings 402 and 404 may be formed as a plurality of contact holes. The first electrodes 42 may be connected to each other at an edge of a first side thereof, and the second electrodes 44 may be connected to each other at an edge of a second side thereof. However, the embodiment of the invention is not limited to the above examples.

Referring back to FIG. 1, the passivation layer 24 may be disposed on the semiconductor substrate 10, and the anti-reflection layer 26 may be formed on the passivation layer 24. The passivation layer 24 and the anti-reflective layer 26 may be substantially entirely formed on the front surface of the semiconductor substrate 10. In this regard, the expression "entirely formed" as used herein includes an instance in which the passivation layer 24 and the anti-reflective layer 26 are physically completely formed and an instance in which the passivation layer 24 and the anti-reflective layer 26 are incompletely formed by an unavoidable reason, process errors or process inaccuracies.

The passivation layer 24 is formed on the front surface of the semiconductor substrate 10 in contact therewith and thus inactivates defects present in the front surface or bulk of the semiconductor substrate 10. Thus, recombination sites of minority carriers are removed and, accordingly, an open circuit voltage Voc of the solar cell 100 may be increased. Also, by the anti-reflection layer 26, the amount of light reaching a pn junction formed at an interface between the base region 110 and the first conductive type region 32 may be increased by reducing the reflectance of light incident upon the front surface of the semiconductor substrate 10. Accordingly, a short-circuit current Isc of the solar cell 100 can be increased. As such, the open circuit voltage and the short-circuit current Isc of the solar cell 100 can be increased by the passivation layer 24 and the anti-reflective layer 26 and, accordingly, the efficiency of the solar cell 100 can be enhanced.

The passivation layer 24 or the anti-reflective layer 26 may be formed of one or more of various materials. For example, the passivation layer 24 or the anti-reflection layer 26 may be any one layer selected from the group consisting of a silicon nitride layer, a hydrogen-containing silicon nitride layer, a silicon oxide layer, a silicon oxynitride layer, an aluminum oxide layer, a MgF$_2$ layer, a ZnS layer, a TiO$_2$ layer, and a CeO$_2$ layer or have a multilayer structure including two or more of the above-listed layers in combination. For example, the passivation layer 24 may include silicon oxide, and the anti-reflective layer 26 may include silicon nitride. However, the embodiment of the invention is not limited to the above examples. Therefore, the passivation layer 24 and the anti-reflective layer 26 may have various material or various structures. Also, the anti-reflection layer 26 may contact with the semiconductor substrate 10, and the other modifications are possible.

When light is incident upon the solar cell 100 according to the embodiment of the invention, electrons and holes are generated by photoelectric conversion at the pn junction formed between the base region 110 and the first conductive type region 32, and the generated holes and electrons tunnel by tunneling through the tunneling layer 20, respectively move to the first and second conductive type regions 32 and 34 and then respectively migrate to the first and second electrodes 42 and 44. Electric energy is generated thereby.

As in the embodiment of the invention, in the solar cell 100 having a back contact structure in which the first and second electrodes 42 and 44 are formed on the back surface of the semiconductor substrate 10 and not formed on the front surface of the semiconductor substrate 10, shading loss at the front surface of the semiconductor substrate 10 can be minimized. Accordingly, efficiency of the solar cell 100 can be enhanced. However, the embodiment of the invention is not limited to the above examples. For example, at least one of the first and the second conductive type regions 32 and 34 and the first and second electrodes 42 and 44 connected thereto may be disposed on the front surface of the semiconductor substrate 10. Various modifications are possible.

Also, the first and second conductive type regions 32 and 34 are formed on the semiconductor substrate 10 while interposing the tunneling layer 20 therebetween. The first and second conductive type regions 32 and 34 are separate layers from the semiconductor substrate 10. Accordingly, the loss due to the recombination can be minimized, compared with the instance that the doping portion formed by doping the dopants to the semiconductor substrate 10 is used for the conductive type region.

Further, the buffer layer 22 being a separate layer from the tunneling layer 20 and including the buffer portion 22c is disposed on the tunneling layer 20. Thus, the tunneling through the tunneling layer 20 at the undesirable portion can be prevented. Also, the buffer layer 22 is formed of a material being able to form silicon-dopant bond, and therefore, the part of the buffer layer 22 constitutes at least a part of the conductive type regions 32 and 34. Accordingly, the tunneling to a portion of the buffer layer 22 except for the buffer portion 22c can be smooth and active. That is, the undesirable recombination of the electron and the hole can be prevented, and the tunneling of the carrier for the photoelectric conversion can be smooth and active. As a result, efficiency of the solar cell 100 can be enhanced.

In the above structure, the first and second portions 22a and 22b and the buffer portion 22c of the buffer layer 22 are aligned with the first and second doping portion 30a and 30b of the conductive type regions 32 and 34 and the barrier portion 30c, respectively. That is, the side surfaces of the first and second portions 22a and 22b and the buffer portion 22c of the buffer layer 22 are in the same plane with the side surfaces of the first and second doping portion 30a and 30b of the conductive type regions 32 and 34 and the barrier portion 30c, respectively. However, the embodiments of the invention are not limited thereto. By separately forming the first and second portions 22a and 22b from the first and second doping portions 30a and 30b, the positions of the first and second portions 22a and 22b and the positions of the first and second doping portions 30a and 30b may be different. For example, at least one of the side surfaces of the first and second portions 22a and 22b and the buffer portion 22c of the buffer layer 22 are not aligned with or are deviated from the corresponding side surfaces of the first and second doping portion 30a and 30b of the conductive type regions 32 and 34 and the barrier portion 30c. Various modifications are possible.

Hereinafter, a method for manufacturing the solar cell 100 having the above structure will be described in detail with reference to FIGS. 3a to 3h. FIGS. 3a to 3h are sectional views illustrating a method for manufacturing a solar cell according to an embodiment of the invention.

Figure 3A:
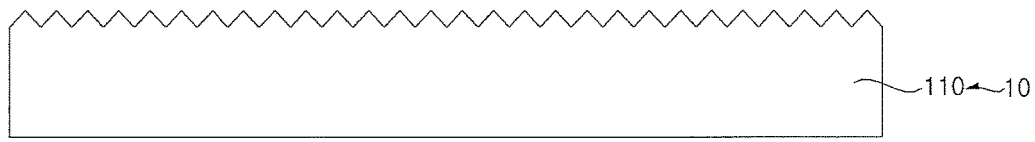
FIGS. 3a to 3h are sectional views illustrating a method for manufacturing a solar cell according to an embodiment of the invention.

First, as shown in FIG. 3a, a semiconductor substrate 10 including a base region 110 having a second conductive type dopant is prepared. In the embodiment of the invention, the semiconductor substrate 10 may be a silicon substrate (for example, a silicon wafer) having an n-type dopant. Examples of the n-type dopant include, but are not limited to, Group V elements such as phosphorous (P), arsenic (As), bismuth (Bi) and antimony (Sb). However, the embodiment of the invention is not limited thereto, and the base region 110 may have a p-type dopant.

At least one of the front and back surfaces of the semiconductor substrate 10 is textured so that the surface is an uneven surface (or have protruded portions and/or depressed portions). A wet or dry texturing method may be used for the texturing of the surface of the semiconductor substrate 10. A wet texturing may be carried out by dipping the semiconductor substrate 10 in a texturing solution and has an advantage of a short process time. A dry texturing is a process of cutting the surface of the semiconductor substrate 10 using a diamond drill, laser or the like and enables formation of uniform protruded portions and/or depressed portions, but disadvantageously has long process time and causes damage to the semiconductor substrate 10. Alternatively, the semiconductor substrate 10 may be textured by reactive ion etching (RIE) or the like. As such, the semiconductor substrate 10 may be textured by a variety of methods.

For example, the front surface of the semiconductor substrate 10 may be textured to have the protruded portions and/or depressed portions or to be an uneven surface. Meanwhile, the back surface of the semiconductor substrate 10 may be a relatively smooth and even surface formed by mirror polishing or the like and having a lower surface roughness than the front surface of the semiconductor substrate 10. However, the embodiment of the invention is not limited thereto, and thus, the semiconductor substrate 10 having various structures may be used.

Figure 3B:
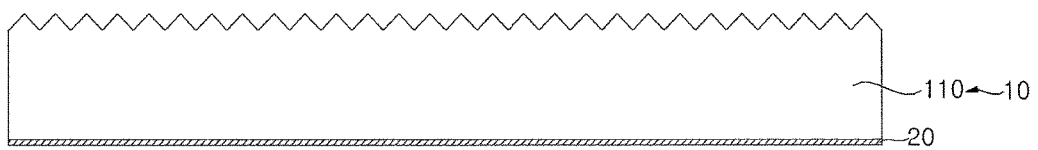

Next, as shown in FIG. 3b, a tunneling layer 20 is formed on the back surface of the semiconductor substrate 10. The tunneling layer 20 may be entirely formed on the back surface of the semiconductor substrate 10.

In this instance, the tunneling layer 20 may be formed, for example, by a method such as thermal growth or deposition (for example, plasma-enhanced chemical vapor deposition (PECVD), atomic layer deposition (ALD)) or the like. Particularly, the tunneling layer 20 may be an amorphous silicon oxide layer having an amorphous structure formed by the chemical vapor deposition. However, the embodiment of the invention is not limited thereto and the tunneling layer 20 may be formed by a variety of methods.

Figure 3C:
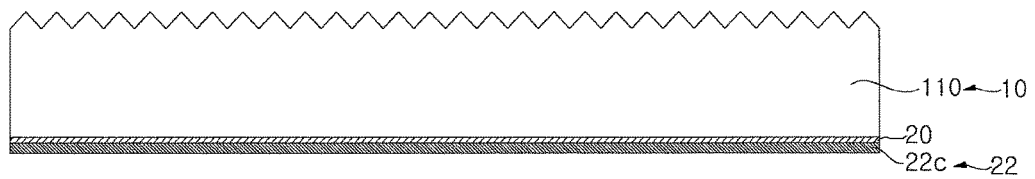

Next, as shown in FIG. 3*c*, the buffer layer 22 is formed on the tunneling layer 20. The buffer layer 22 is entirely formed on the back surface of the semiconductor substrate 10, on the tunneling layer 20.

The buffer layer 22 may be formed by one or more of various methods. For example, the buffer layer 22 may be formed by an atmospheric pressure chemical vapor disposition (APCVD) method, a low pressure chemical vapor deposition (LPCVD) method, and so on. Particularly, the buffer layer 22 may be formed by the LPCVD method so that the buffer layer 22 including the silicon oxide layer can have a desirable composition and a poly-crystalline structure. The crystalline property of the buffer layer 22 is affected from pressure. Thus, the LPCVD method is suitable for forming the buffer layer 22 having superior crystalline property. However, the embodiments of the invention are not limited thereto.

Various materials may be used as source gases for forming the buffer layer 22 including the silicon oxide layer. For example, the source gases may be nitric oxide (for example, $N_2O$) and silane ($SiH_4$). The ratio of the nitric oxide: the silane may be about 1:0.01 to 1:0.35. By the materials and the ratio, the buffer layer 22 having a desirable composition can be stably formed. However, the embodiments of the invention are not limited thereto, and thus, various source gases may be used.

The temperature for forming the buffer layer 22 may be about 600° C. to about 1000° C. (more particularly, about 600° C. to about 675° C.). When the temperature is smaller than about 600° C., the silicon oxide layer may have an amorphous structure. When the temperature is larger than about 1000° C., a part of the silicon oxide layer may have a single crystalline structure. In order to maximize properties of the poly-crystalline structure, the temperature for forming the buffer layer 22 may be about 600° C. to about 675° C. However, the embodiments of the invention are not limited, and thus, the temperature for forming the buffer layer 22 may be varied.

In this instance, the buffer layer 22 is not doped, and thus, the buffer layer 22 in this stage may be formed of or consists of the buffer portion 22*c* only.

In the embodiment of the invention, it is exemplified that the buffer layer 22 includes the silicon oxide layer, but the invention is not limited thereto. Thus, the buffer layer 22 may have a material, a composition, and a crystalline structure different from those described in the above.

Figure 3D:
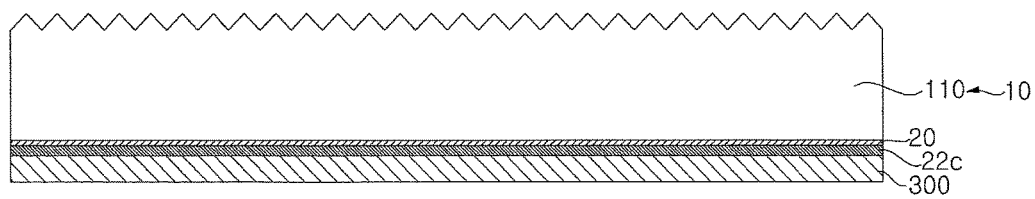
Figure 3E:
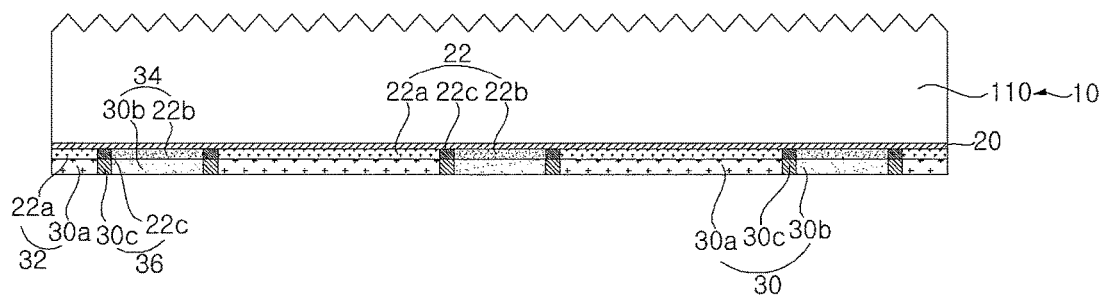

Then, as shown in FIGS. 3*d* and 3*e*, a first conductive type region 32 and a second conductive type region 34 are formed on the tunneling layer 20. This will be described in more detail.

As shown in FIG. 3*d*, a semiconductor layer 300 being intrinsic is formed on the tunneling layer 20 (more particularly, on the buffer layer 22). The semiconductor layer 300 may be formed of an amorphous, microcrystalline, or poly-crystalline semiconductor. In this instance, the semiconductor layer 300 may be formed by a method, for example, thermal growth, deposition (for example, plasma-enhanced chemical vapor deposition chemical (PECVD)) or the like. However, the embodiment is not limited thereto, the semiconductor layer 300 may be formed by various methods.

Next, as shown in FIG. 3*e*, first conductive type regions 32, second conductive type regions 34, and barrier areas 36 are formed by doping dopants.

For example, a region of the semiconductor layer 30 is doped with a first conductive type dopant to form the first doping portion 30*a* by various methods such as an ion implantation method, a thermal diffusion method, or a laser doping method, and another region thereof is doped with a second conductive type dopant to form the second doping portion 30*b* by various methods such as an ion implantation method, a thermal diffusion method, or a laser doping method. Then, the barrier portion 30*c* may be formed in a region of the semiconductor layer 30 between the first and second doping portions 30*a* and 30*b*.

Also, the first conductive type dopant in the first doping portion 30*a* is diffused into the buffer layer 22 during the heat-treating for the activation performed after the ion-implantation method or during the heat-treating performed at the thermal diffusion method or the laser doping method, and thus, the first portion 22*a* is formed. Similarly, the second conductive type dopant in the second doping portion 30*b* is diffused into the buffer layer 22 during the heat-treating for the activation performed after the ion-implantation method or during the heat-treating performed at the thermal diffusion method or the laser doping method, and thus, the second portion 22*b* is formed. The first and second conductive type dopants are not diffused to a portion of the barrier layer 22 corresponding to the barrier portion 30*c*, and thus, the portion of the barrier layer 22 constitutes the buffer portion 22*c* to correspond to the barrier portion 30*c*.

Thereby, the first conductive type region 32 including the first portion 22*a* and the first doping portion 30*a*, the second conductive type region 34 including the second portion 22*b* and the second doping portion 30*b*, and the barrier region 36 including the buffer portion 22*c* and the barrier portion 30*c* are formed.

In the embodiment of the invention, it is exemplified that the first and second portions 22*a* and 22*b* of the buffer layer 22 are formed by the diffusion of the dopants at the doping process of the first and second doping portions 30*a* and 30*b* or the follow-up heat treating. Then, the process can be simplified. However, the embodiments of the invention are not limited thereto, and various modifications are possible. For example, the first and second portions 22*a* and 22*b* may be formed by a separate doping process. In addition, various methods may be used for a method for forming the conductive type regions 32 and 34, and barrier region 36. Also, the barrier region 36 may be not formed. That is, various modifications are possible.

Figure 3F:
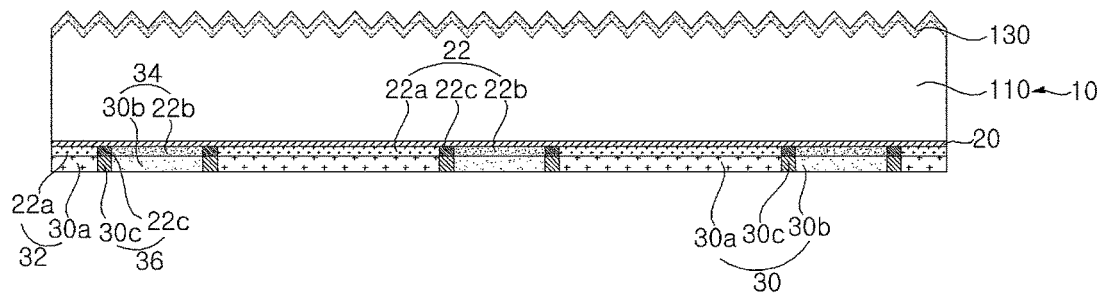

Next, as shown in FIG. 3*f*, a front surface field region 130 may be formed by doping the second conductive type dopant to the front surface of the semiconductor substrate 10. The front surface field region 130 may be formed by various methods, such as an ion implantation method, a thermal diffusion method, or a laser doping method. Also, the front surface field region 130 may be not formed.

Figure 3G:
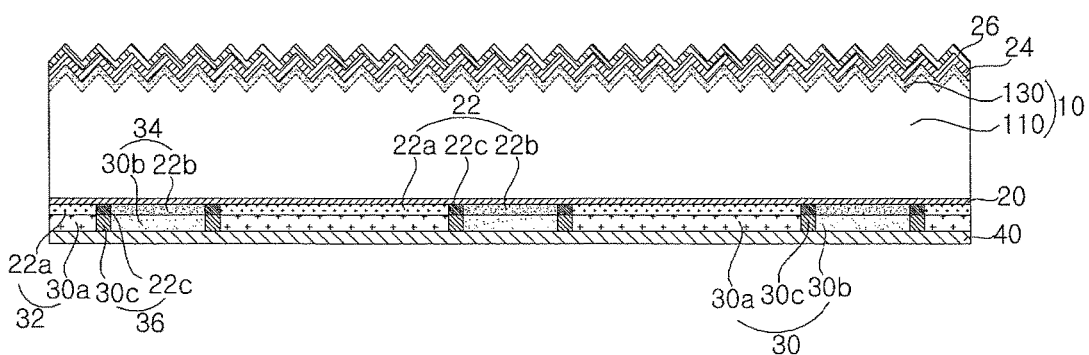
Figure 3H:
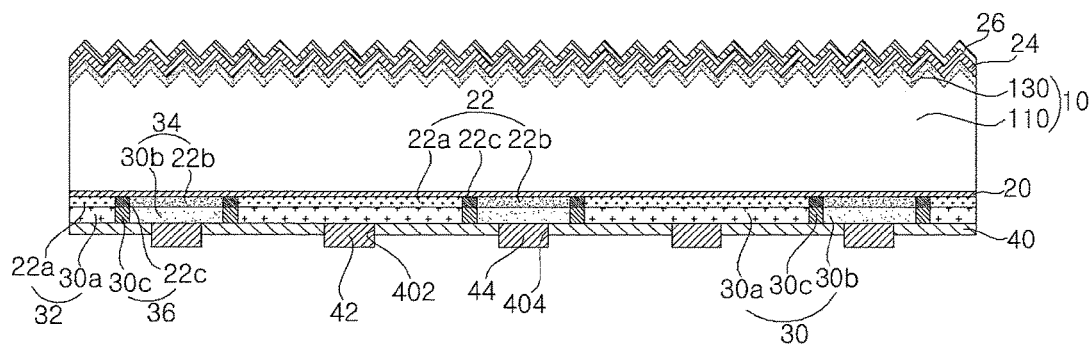

Next, as shown in FIG. 3*g*, a passivation layer 24 and an anti-reflective layer 26 are sequentially formed on the front surface of the semiconductor substrate 10, and an insulating layer 40 is formed on the rear surface of the semiconductor substrate 10. That is, the passivation layer 24 and the anti-reflective layer 26 are formed over the entire portion of the front surface of the semiconductor substrate 10, and the insulating layer 40 are formed over the entire portion of the rear surface of the semiconductor substrate 10. The passivation layer 24, the anti-reflective layer 26, and the insulating layer 40 may be formed by a variety of methods such as vacuum deposition, chemical vapor deposition, spin coating, screen printing or spray coating. A formation order of the passivation layer 24 and the anti-reflective layer 26, and the insulating layer 40 may be varied.

Next, as shown in FIG. 3g, the first and second electrodes 42 and 44 electrically connected respectively to the first and second conductive type regions 32 and 34 are formed.

In an embodiment of the invention, first and second openings 402 and 404 are formed in the insulating layer 40, and the first and second electrodes 42 and 44 may be formed in the first and second openings 402 and 404 by various methods such as plating, deposition, or the like. In another embodiment of the invention, the first and second electrodes 42 and 44 having the above-described shapes may be formed by respectively applying pastes for forming first and second electrodes on the insulating layer 40 by screen-printing or the like and performing fire through, laser firing contact, or the like thereon. In this instance, the first and second openings 402 and 404 are formed when the first and second electrodes 42 and 44 are formed, and thus, a separate process of forming the first and second openings 402 and 404 need not be performed.

According to the embodiment of the invention, the buffer layer 22 including the buffer portion 22c, and the first and second portions 22a and 22b can be formed by a simple process. Accordingly, productivity of the solar cell 100 having enhanced efficiency can be improved.

Hereinafter, solar cells and methods for manufacturing them according to other embodiments of the invention will be described in detail. A detailed description of the same or almost the same elements as those in the foregoing description will be omitted herein and detailed descriptions of only different elements will be provided herein. The combination of the foregoing embodiment and the modified embodiments thereof and the following embodiments and the modified embodiments thereof fall within the spirit and scope of the embodiments of the invention.

Figure 4:
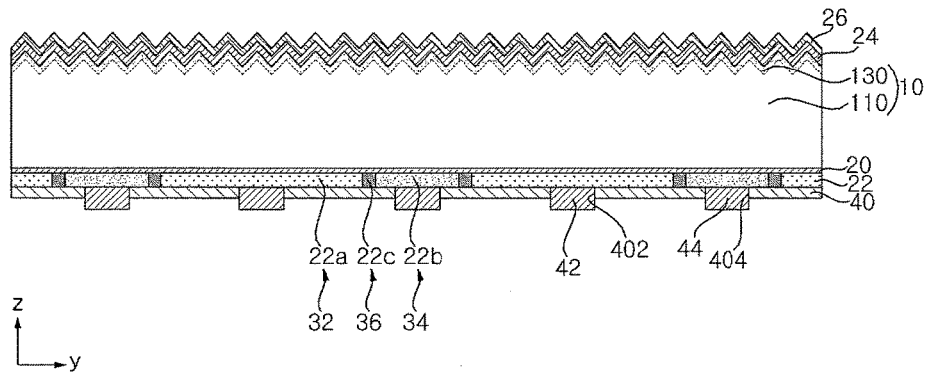
FIG. 4 is a sectional view of a solar cell according to another embodiment of the invention.

FIG. 4 is a sectional view of a solar cell according to another embodiment of the invention.

Referring to FIG. 4, in another embodiment of the invention, a first portion 22a of a buffer layer 22 entirely constitutes a first conductive type region 32, a second portion 22b of the buffer layer 22 entirely constitutes a second conductive type region 34, and a buffer portion 22c of the buffer layer 22 entirely constitutes a barrier region 36. That is, the first conductive type region 32 consists of the first portion 22a only, the second conductive type region 34 consists of the second portion 22b only, and the barrier region 36 consists of the buffer portion 22c only.

As shown in the above, the first and second portions 22a and 22b of the buffer layer 22 are able to act as the conductive type regions 32 and 34, respectively. Thus, in the embodiment of the invention, without the additional semiconductor layer (reference numeral 30 of FIG. 1), only the buffer layer 22 constitutes the conductive type regions 32 and 34. Thereby, the structure of the solar cell 100 can be simplified and the method for manufacturing the solar cell 100 can be simplified.

To manufacture the solar cell 100 where the buffer layer 22 solely acts as the conductive type regions 32 and 34, the buffer layer 22 consisting of the buffer portion 22c is formed as shown in FIG. 3b, and then, the first and second conductive type dopants are doped to the buffer layer 22. The descriptions of the doping of the semiconductor layer 30 referring to FIG. 3e may be intactly applied to the doping of the first and second conductive type dopants to the buffer layer 22. Thus, detailed descriptions are omitted.

In the embodiment of the invention, the buffer layer 22 may have a thickness of about 300 nm or less (more particularly, about 2 nm to about 300 nm). This is because the buffer layer 22 has sufficient thickness suitable to act as the conductive type regions 32 and 34. The buffer layer 22 may have the thickness of about 100 nm to about 300 nm to effectively act as the conductive type regions 32 and 34. However, the embodiments of the invention are not limited thereto, and thus, the thickness of the buffer layer 22 may be varied.

The buffer layer 22 has a uniform oxygen amount in a thickness direction of the buffer layer 22. That is, as in the descriptions referring to FIG. 1, the oxygen amount of the buffer layer 22 may be a uniform value in a range of about 10 at % to about 45 at % in the thickness direction of the buffer layer 22. However, the embodiments of the invention are not limited thereto.

That is, a portion of the buffer layer 22 adjacent to the tunneling layer 20 has a relatively high oxygen amount and a relatively low silicon amount in order to prevent the undesirable tunneling. On the other hand, another portion of the buffer layer 22 far from the tunneling layer 20 (that is, adjacent to the electrodes 42 and 44) has a relatively low oxygen amount and a relatively high silicon amount in order to achieve electrical properties. For example, the portion of the buffer layer 22 adjacent to the tunneling layer 20 may have the oxygen amount of about 10 at % to about 45%, and the another portion of the buffer layer 22 far from the tunneling layer 20 may have the oxygen amount of about 10 at % or less (that is, about 0 at % to about 10 at %) and the silicon amount of about 90 at % or more (that is, about 90 at % to about 100 at %).

For example, as the distance to the tunneling layer 20 increases, the oxygen amount of the buffer layer 22 gradually decreases and the silicon amount of the buffer layer 22 gradually increases. The buffer layer 22 may be formed by gradually varying the amount of the source gases used for forming the buffer layer 22.

Figure 5:
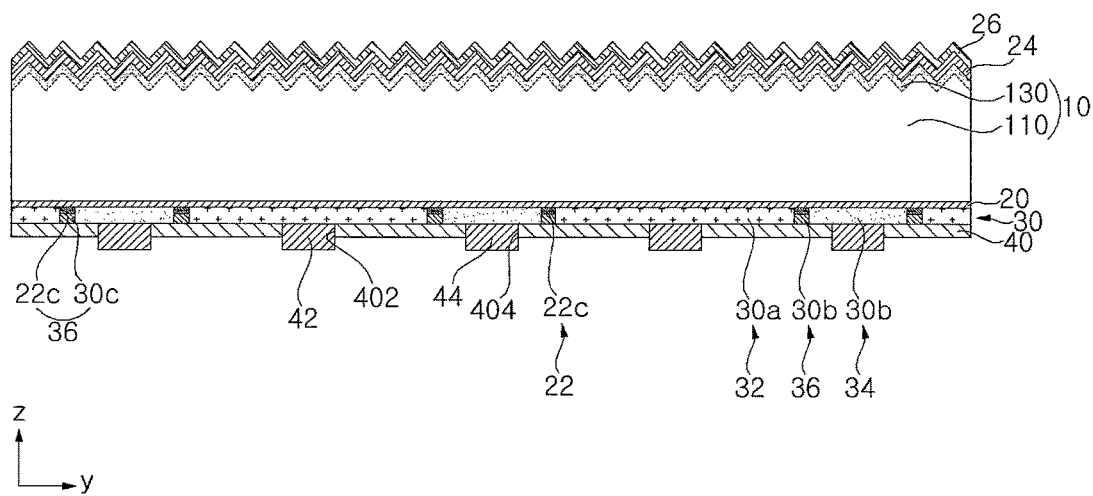
FIG. 5 is a sectional view of a solar cell according to a still another embodiment of the invention.

FIG. 5 is a sectional view of a solar cell according to a still another embodiment of the invention.

Referring to FIG. 5, in the embodiment of the invention, the buffer layer 22 includes a buffer portion 22c only, and does not include first and second portions (reference numerals 22a and 22b of FIG. 1). That is, the buffer layer 22 is partially positioned to correspond to a portion between the first conductive type region 32 and the second conductive type region 34.

The buffer layer 22 may be formed by entirely forming the buffer layer 22 on the tunneling layer 20 (as shown in FIG. 3b) and patterning the buffer layer 22. In the patterning of the buffer layer 22, portions of the buffer layer 22 that will correspond to the first and second conductive type regions 32 and 34 are eliminated. As shown in another embodiment of the invention, the buffer layer 22 may be formed by partially forming the buffer layer 22 to correspond to the buffer portion 22c through using a mask or a mask layer.

In the embodiment of the invention, the first conductive type region 32 consists of the first doping portion 30a only, and the second conductive type region 34 consists of the second doping portion 30b only. Thus, the doping properties of the first and second conductive type regions 32 and 34 can be enhanced. Between the first conductive type region 32 and the second conductive type region 34, the buffer portion 22c is positioned between the tunneling layer 20 and the barrier portion 30c, thereby effectively preventing the undesirable tunneling to the barrier portion 30c.

It is exemplified that the position of the buffer portion 22c is the same as the position of the barrier portion 30c. Thus, the side surfaces of the buffer portion 22c are aligned or are in the same plane with the side surfaces of the barrier portion 30c. However, the embodiments of the invention are not limited thereto. Thus, the side surfaces of the buffer portion 22c may be not aligned or be not in the same plane with the side surfaces of the barrier portion 30c. For example, the buffer portion 22c has a width larger than a width of the barrier portion 30c, and the buffer portion 22c may entirely cover the barrier portion 30c. The other various modifications are possible.

Particular characteristics, structures, or effects described in connection with the embodiment of the invention are included in at least one embodiment of the embodiment of the invention and not necessarily in all embodiments of the invention. Furthermore, the particular characteristics, structures, or effects of any specific embodiment of the embodiment of the invention may be combined in any suitable manner with one or more other embodiments of the invention or may be changed by those skilled in the art to which the embodiments of the invention pertain. Therefore, it is to be understood that contents associated with such combination or change fall within the spirit and scope of the embodiment of the invention.

Although embodiments of the invention have been described with reference to a number of illustrative embodiments of the invention, it should be understood that numerous other modifications and applications may be devised by those skilled in the art that will fall within the intrinsic aspects of the embodiments of the invention. More particularly, various variations and modifications are possible in concrete constituent elements of the embodiments. In addition, it is to be understood that differences relevant to the variations and modifications fall within the spirit and scope of the embodiment of the invention defined in the appended claims.

What is claimed is:

1. A solar cell, comprising:
   a semiconductor substrate;
   a tunneling layer on a surface of the semiconductor substrate;
   a semiconductor layer formed on the tunneling layer, and including a first conductive type semiconductor region doped with a first dopant having a first conductive type, a second conductive type semiconductor region doped with a second dopant having a second conductive type opposite to the first conductive type;
   a barrier region having an intrinsic semiconductor between the first conductive type semiconductor region and the second conductive type semiconductor region; and
   a buffer layer positioned between the tunneling layer and a portion of the barrier region,
   wherein the tunneling layer and the buffer layer comprise an oxide,
   wherein the buffer layer comprises:
     a first portion having the first conductive type;
     a second portion having the second conductive type; and
     a buffer portion between the first portion and the second portion,
   wherein the buffer portion includes an undoped material,
   wherein the semiconductor layer comprises silicon,
   wherein the first conductive type semiconductor region, the second conductive type semiconductor region and the barrier region are positioned on a first plane,
   wherein the first portion, the second portion and the buffer portion are positioned on a second plane,
   wherein the buffer portion is in contact with the barrier region,
   wherein the first portion is entirely overlapped with the first conductive type semiconductor region, the second portion is entirely overlapped with the second conductive type region, and the buffer portion is entirely overlapped with the barrier region,
   wherein a portion of the second portion adjacent to the tunneling layer has an oxygen amount larger than that of another portion of the second portion further from the tunneling layer, and the portion of the second portion adjacent to the tunneling layer has a silicon amount smaller than that of the another portion of the second portion further from the tunneling layer,
   wherein the tunneling layer has an amorphous structure, and
   wherein the buffer layer has a poly-crystalline structure wherein the buffer layer comprises a silicon oxide layer and the tunneling layer comprises another silicon oxide layer, an oxygen amount of the buffer layer is smaller than an oxygen amount of the tunneling layer, and a silicon amount of the buffer layer is larger than a silicon amount of the tunneling layer.

2. The solar cell according to claim 1, wherein the tunneling layer comprises an insulating material.

3. The solar cell according to claim 1, wherein the buffer layer comprises a silicon oxide layer.

4. The solar cell according to claim 3, wherein the silicon oxide layer of the buffer layer comprises a portion having oxygen with an amount of about 10 at % to about 45 at %.

5. The solar cell according to claim 3, wherein the buffer layer comprises a portion having a chemical formula of SiOx, wherein, x is in a range of about 0.2 to about 1.5.

6. The solar cell according to claim 1, wherein the oxygen amount of the tunneling layer is in a range of about 60 at % to about 70 at %, and
   the buffer layer comprises a portion having the oxygen amount of about 10 at % to 45 at %.

7. The solar cell according to claim 1, wherein the tunneling layer has a chemical formula of SiOy, wherein, y is in a range of about 1.9 to about 2.1, and
   the buffer layer comprises a portion having a chemical formula of SiOx, wherein, x is in a range of about 0.2 to about 1.5.

8. The solar cell according to claim 1, wherein the buffer layer is thicker than the tunneling layer.

9. The solar cell according to claim 8, wherein a ratio of a thickness of the tunneling layer to a thickness of the buffer layer is in a range of about 1:1.5 to about 1:10.

10. The solar cell according to claim 8, wherein the tunneling layer has a thickness of about 1.8 nm or less, and the buffer layer has a thickness of about 10 nm or less.

11. The solar cell according to claim 1, wherein a portion of the first portion adjacent to the tunneling layer has an oxygen amount larger than that of another portion of the first portion further from the tunneling layer, and the portion of the first portion adjacent to the tunneling layer has a silicon amount smaller than that of the another portion of the first portion further from the tunneling layer.

12. The solar cell according to claim 1, wherein the first conductive type semiconductor region further comprises a first doping portion having the first conductive type on the first portion of the buffer layer,
   the second conductive type semiconductor region further comprises a second doping portion having the second conductive type on the second portion of the buffer layer, a doping concentration of the first portion of the buffer layer is smaller than a doping concentration of the first doping portion, and
a doping concentration of the second portion of the buffer layer is smaller than a doping concentration of the second doping portion.

13. A method for manufacturing a solar cell, the method comprising:
forming a tunneling layer on a surface of a semiconductor substrate;
forming a buffer layer on the tunneling layer; and
forming a semiconductor layer on the buffer layer, the semiconductor layer including a first conductive type semiconductor region doped with a first dopant having a first conductive type, a second conductive type semiconductor region doped with a second dopant having a second conductive type opposite to the first conductive type, a barrier region having an intrinsic semiconductor between the first conductive type semiconductor region and the second conductive type semiconductor region,
wherein the buffer layer is positioned between the tunneling layer and a portion of the barrier region,
wherein the tunneling layer and the buffer layer comprise an oxide,
wherein the buffer layer comprises:
a first portion having the first conductive type;
a second portion having the second conductive type; and
a buffer portion between the first portion and the second portion,
wherein the buffer portion includes an undoped material,
wherein the semiconductor layer comprises silicon,
wherein the first conductive type semiconductor region, the second conductive type semiconductor region and the barrier region are positioned on a first plane,
wherein the first portion, the second portion and the buffer portion are positioned on a second plane,
wherein the buffer portion is in contacted with the barrier region,
wherein the first portion is entirely overlapped with the first conductive type semiconductor region, the second portion is entirely overlapped with the second conductive type region, and the buffer portion is entirely overlapped with the barrier region,
wherein a portion of the second portion adjacent to the tunneling layer has an oxygen amount larger than that of another portion of the second portion further from the tunneling layer, and the portion of the second portion adjacent to the tunneling layer has a silicon amount smaller than that of the another portion of the second portion further from the tunneling layer,
wherein the tunneling layer has an amorphous structure, and
wherein the buffer layer has a poly-crystalline structure wherein the buffer layer comprises a silicon oxide layer and the tunneling layer comprises another silicon oxide layer, an oxygen amount of the buffer layer is smaller than an oxygen amount of the tunneling layer, and a silicon amount of the buffer layer is larger than a silicon amount of the tunneling layer.

14. The method according to claim 13, wherein the buffer layer is formed by a low pressure chemical vapor deposition (LPCVD) method, and
the buffer layer comprises a silicon oxide layer having a poly-crystalline structure.

15. The solar cell according to claim 1, further comprising:
an electrode connected to the first and second conductive type semiconductor regions,
wherein the buffer layer is positioned adjacent to the tunneling layer and is apart from the electrode.

16. The method according to claim 13, further comprising:
forming an electrode connected to the first and second conductive type semiconductor regions.

* * * * *